United States Patent
Isham et al.

(10) Patent No.: US 9,088,208 B2
(45) Date of Patent: Jul. 21, 2015

(54) SYSTEM AND METHOD FOR HIGH PRECISION CURRENT SENSING

(75) Inventors: Robert H. Isham, Flemington, NJ (US); Jue Wang, Hillsborough, NJ (US)

(73) Assignee: Intersil Americas LLC, Milpitas, CA (US)

( * ) Notice: Subject to any disclaimer, the term of this patent is extended or adjusted under 35 U.S.C. 154(b) by 777 days.

(21) Appl. No.: 12/840,958

(22) Filed: Jul. 21, 2010

(65) Prior Publication Data

US 2011/0181253 A1 Jul. 28, 2011

Related U.S. Application Data

(60) Provisional application No. 61/298,686, filed on Jan. 27, 2010.

(51) Int. Cl.
| | | |
|---|---|---|
| *G05F 5/00* | (2006.01) | |
| *H02M 3/156* | (2006.01) | |
| *G01R 19/00* | (2006.01) | |
| G05F 1/00 | (2006.01) | |
| H02M 1/00 | (2007.01) | |

(52) U.S. Cl.
CPC ............ *H02M 3/156* (2013.01); *G01R 19/0092* (2013.01); *H02M 2001/0009* (2013.01)

(58) Field of Classification Search
USPC .................................................. 323/301, 247
See application file for complete search history.

(56) References Cited

U.S. PATENT DOCUMENTS

| | | | | |
|---|---|---|---|---|
| 5,889,387 A | * | 3/1999 | Massie ........................ | 320/145 |
| 6,246,220 B1 | * | 6/2001 | Isham et al. .................. | 323/224 |
| 6,373,732 B1 | * | 4/2002 | Patel et al. ...................... | 363/72 |
| 7,233,132 B1 | * | 6/2007 | Dong et al. ................... | 323/272 |
| 7,550,872 B2 | * | 6/2009 | Hoekstra et al. ................ | 307/64 |
| 2004/0080353 A1 | * | 4/2004 | Toumazou et al. ........... | 327/350 |
| 2005/0088156 A1 | | 4/2005 | Cheung et al. | |
| 2005/0128005 A1 | * | 6/2005 | Li et al. ........................ | 330/297 |
| 2005/0179423 A1 | | 8/2005 | Xing | |
| 2005/0285580 A1 | * | 12/2005 | Chen et al. ................... | 323/282 |
| 2008/0136399 A1 | * | 6/2008 | Alfano et al. ................. | 323/301 |
| 2008/0143187 A1 | | 6/2008 | Hoekstra et al. | |

FOREIGN PATENT DOCUMENTS

| | | |
|---|---|---|
| CN | 1265479 | 9/2000 |
| TW | 490920 | 7/1999 |
| TW | 480380 | 3/2002 |
| TW | 517441 | 1/2003 |
| TW | 200522506 | 7/2005 |
| TW | 200841556 | 10/2008 |

* cited by examiner

*Primary Examiner* — Adolf Berhane
*Assistant Examiner* — Henry Lee, III
(74) *Attorney, Agent, or Firm* — Paul A. Bernkopf; Bryan A. Santarellli

(57) ABSTRACT

An apparatus for sensing an input current through an inductor includes an RC circuit connected in parallel with the inductor across first and second input pins of an integrated circuit. A voltage monitoring circuit monitors a first voltage at the first input pin of the integrated circuit and monitors a second voltage at the second input pin of the integrated circuit. An op-amp compares the first voltage with the second voltage and generates a control output responsive to the comparison. A current sink circuit responsive to the indication controls the first voltage to substantially equal the second voltage.

20 Claims, 4 Drawing Sheets

SYSTEM AND METHOD FOR HIGH PRECISION CURRENT SENSING

CROSS-REFERENCE TO RELATED APPLICATIONS

This application claims priority from U.S. Provisional Application No. 61/298,686, filed Jan. 27, 2010, entitled HIGH PRECISION CURRENT SENSING METHOD FOR USE IN AN INTEGRATED CIRCUIT, which is incorporated herein by reference.

BRIEF DESCRIPTION OF THE DRAWINGS

For a more complete understanding, reference is now made to the following description taken in conjunction with the accompanying Drawings in which.

DETAILED DESCRIPTION

Figure 1:
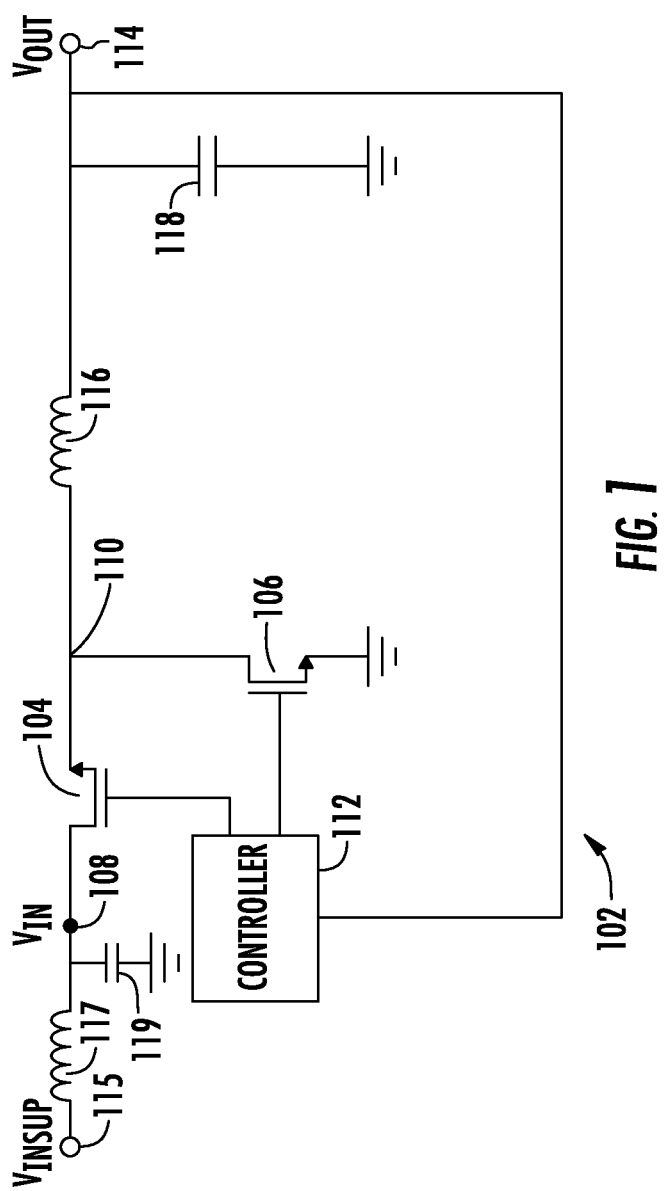
FIG. 1 is a schematic diagram of a switching power supply.

Referring now to the drawings, wherein like reference numbers are used herein to designate like elements throughout, the various views and embodiments of a system and method for high precision current sensing are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Within integrated switching power supplies, there is a need to be able to accurately sense an input current to the power supply. Accurate sensing of the input current can prevent the power supply chip from being damaged in the case of a catastrophic failure. Additionally, the availability of accurate real-time current measurements enables the calculation of instantaneous input power to a circuit. The availability of information with respect to the input current and input power is of great benefit to circuit designers and device users. One manner of monitoring input current involves the use of the DC resistance (DCR) of an input inductor as a current sense resistor. The DC resistance of an input inductor is usually in the range of 0.3 to 0.5 milliohms. In typical applications, the voltage drop across the inductor DCR with full load is only 6-10 millivolts and the common mode voltages of the DCR are well above the supply voltage available to power an associated integrated circuit. These factors make it a challenging task to obtain precise input current information. Additionally, when used with switching mode power supplies, the signals at the input inductor terminals are often noisy due to the switching action further increasing the difficulty of accurately sensing real-time input current.

Referring now to FIG. 1, there is illustrated a simplified schematic block diagram of a switching power supply 102. The switching power supply 102 includes a first switching transistor 104 and a second switching transistor 106. The switching transistor 104 is connected between an input voltage node 108 and a phase node 110. Switching of each of the power switching transistors 104 and 106 are provided by an associated controller 112 responsive to a monitored output voltage at node 114. An inductor 116 is connected between the phase node 110 and the output voltage node 114. An output capacitor 118 is connected between the output voltage node 114 and ground. The power switching transistor 106 is connected between the phase node 110 and ground.

A typical switching regulator 102 may use 12 volts or higher as the supply to the power train (switches and inductors), but the controller 112 may only run from 3.3 or 5 volts. Sensing the input current at the input voltage node 108 by using the DCR drop of the input inductor 117 may require adding additional circuitry external to the controller 112 that can handle the input voltage range. This circuitry may include a relatively expensive low offset amplifier. The input inductor 117 is located between the input node 108 of the voltage regulator and a node 115 to which the supply voltage Vinsup is applied. A capacitor 119 is connected between node 108 and ground. An additional method may be to use a resistor bridge to bring the DCR voltages within the voltage range of the controller 112. However, the practical limits of resistor matching may not satisfy the precision requirement of the current sensing.

Figure 2:
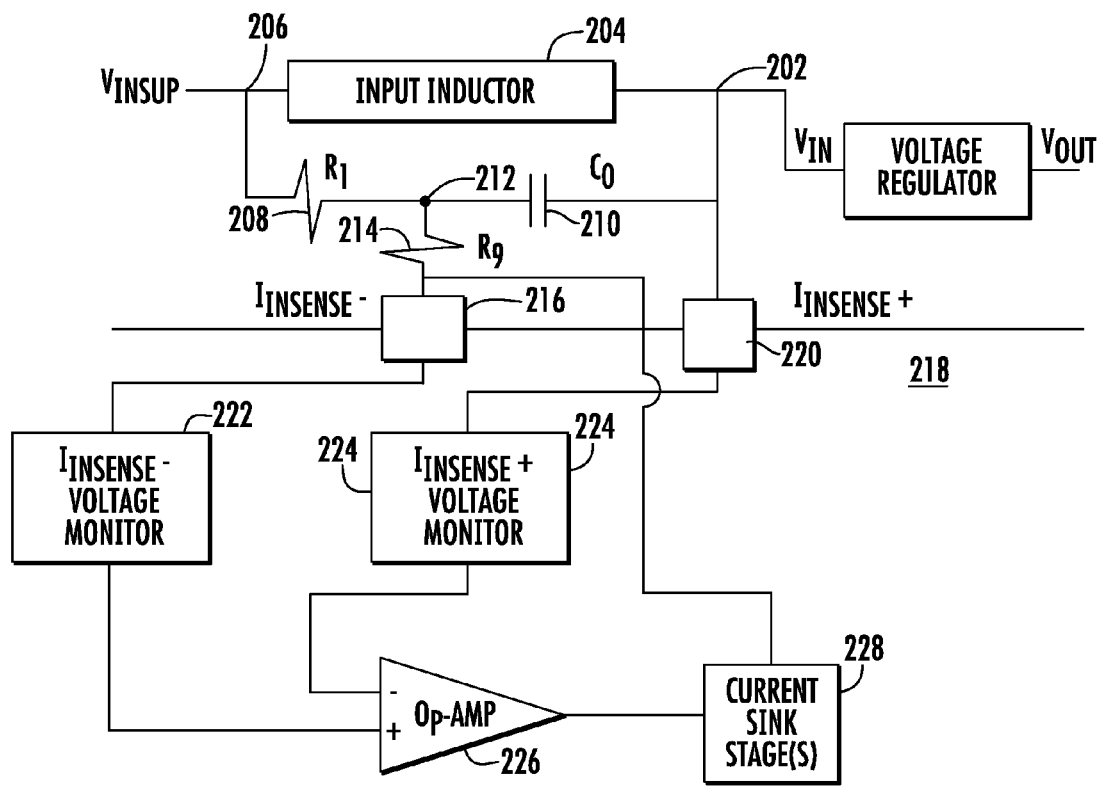
FIG. 2 is a functional block diagram of the circuitry for providing high precision current sensing.

Referring now to FIG. 2, there is illustrated a functional block diagram of the circuitry for providing high precision current sensing at the input node 108. The supply voltage Vinsup is provided at node 206. The input voltage $V_{IN}$ to the voltage regulator 205 is supplied at node 202. The supply voltage Vinsup passes through an input inductor 204 that provides the input voltage Vin at node 202. The DC resistance (DCR) of the inductor 204 may be used to determine the input current using the additional circuitry illustrated in FIG. 2. A resistor 208 and capacitor 210 are connected in parallel with the input inductor 204 and its DC resistance between node 206 and 202. The resistor 208 is connected between node 206 and node 212. The capacitor 210 is connected between node 212 and node 202. A resistor 214 is connected between node 212 and the Iinsense− pin 216 of an associated integrated circuit chip 218.

A second pin 220 Iinsense+ of the integrated circuit 218 is connected to the output voltage node 202. Iinsense− voltage monitoring circuitry 222 monitors the voltage at the Iinsense− pin 216. Similarly, the Iinsense+ voltage monitor circuitry 224 monitors the voltage at the Iinsense+ pin 220. A voltage responsive to the detected current at pin 216 and a voltage responsive to the current detected at pin 220 are provided to an operational amplifier 226 by the circuitry 222 and circuitry 224, respectively. The voltage responsive to the Iinsense+ pin 220 is applied to the inverting input of the op-amp 226 and the voltage responsive to the Iinsense− pin 216 is applied at the non-inverting node of operational amplifier 226. The output of the operational amplifier 226 is provided to one or more current sink stages 228 which are used for sinking current from Iinsense− pin 216 in an attempt to equalize the voltages at the Iinsense− pin 216 and Iinsense+ pin 220.

Figure 3:
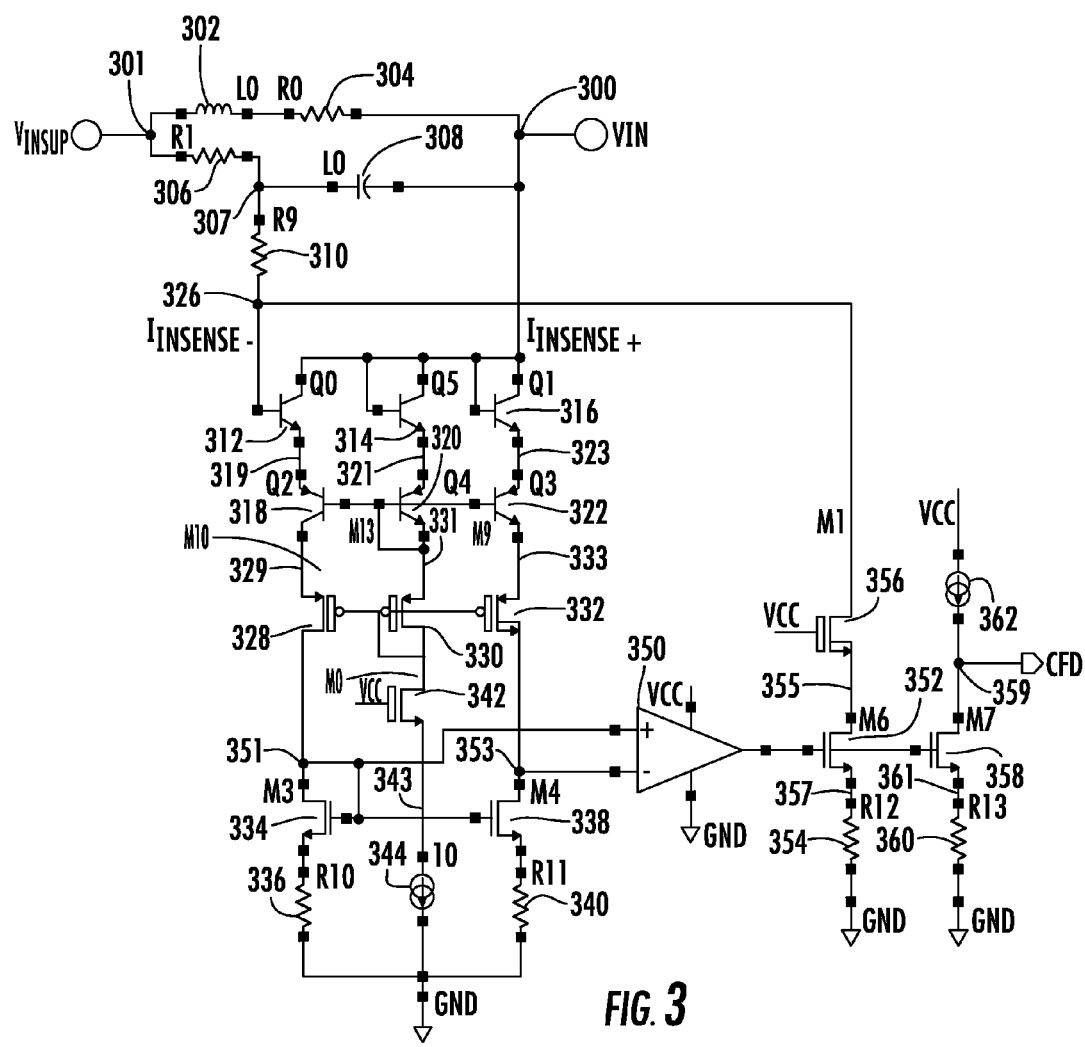
FIG. 3 is a schematic diagram more particularly illustrating the circuitry for providing high precision current sensing.

Referring now to FIG. 3, there is provided a schematic diagram more fully illustrating the circuitry for providing high precision current sensing. A typical switching regulator uses a 12 volt or higher supply voltage to the power train (switches and inductors), applying control signals to the power switches. Sensing the input current by utilizing the DC resistance drop across the inductor of the input filter may require additional circuitry that is external to the controller that is capable of handling this input voltage range. This type of circuitry may include a relatively expensive low offset amplifier. Alternative methods may use resistor bridges to bring the DC resistance voltages within the voltage range of the controller. However, this process may be beyond the practical limits of resistor matching.

The implementation illustrated in FIG. 3 provides a way for a controller of a switching power supply to input and measure the DCR signals at an input even if the common mode voltage is well above the controller supply voltage. The implementation works with an input common mode voltage range from 3 volts to 50 volts and higher. The circuit implementation is simple and effective and only requires a small bias current.

The input voltage $V_{IN}$ is provided at node 300. The supply voltage Vinsup is applied at node 301. The input inductance between node 300 and node 301 consists of an input inductor 302 and a series DC resistance (DCR) 304, which are represented as distinct component in FIG. 3 to simplify the present description. $V_{IN}$ applied at node 300 includes the power rail for the power supply system for which current is drawn by either a linear or switching regulator. Each of the resistor 306, capacitor 308 and resistor 310 are component that are external to the integrated circuit. The network consisting of resistor 306, capacitor 308 and resistor 310 are used to filter out the AC component of the input current. The resistor 306 is connected between node 301 and node 307. The capacitance 308 is connected in series with resistor 306 and is connected between node 307 and node 300. Resistor 310 is connected between node 307 and node 326 which comprises the Iinsense− pin of the integrated circuit. As discussed previously with respect to FIG. 2, the Iinsense+ pin of the integrated circuit is copied to the input voltage node 300.

The resistor 306 and capacitor 308 comprise an RC circuit that is place in parallel with the inductance between nodes 301 and 300 consisting of inductor 302 and resistor 304. If the RC time constant of the RC circuit consisting of resistor 306 and capacitor 308 matches the time constant of the L/DCR circuit consisting of inductance 302 and resistance 304, the voltage across the capacitor 308 will match the voltage across the DC resistance 304. As further described herein below, the circuit within the integrated circuit forces the voltage at pin Iinsense− at node 326 to equal the voltage at the pin Iinsense+ at node 300. The RC time constant is equal to the parallel combination of the resistor 306 and resistor 310 times the capacitor 308. This is the RC time constant that should be equal to the value of the inductor 302 divided by the DCR resistance 304. The current flowing through the series connection of resistor 306 and resistor 310 from node 301 to node 326 becomes equal to the voltage across the DCR resistance 304 divided by the resistance of resistor 306 plus the resistance of resistor 310 (i.e. the voltage drop across the resistors 306 and 310 equals the voltage drop across the DCR resistance 304). By knowing the values of resistors 304, 306 and 310, the current flowing into the Iinsense− pin at node 326 becomes a known ratio to the current flowing through the inductor 302 and the DCR resistance 304.

Forcing the voltage sensed at the Iinsense− pin 326 to be equal to the voltage at the Iinsense+ pin at node 300 is achieved by the internal circuitry of the integrated circuit connected with the Iinsense− inp and the Iinsense+ pin. With respect to the following discussion, it is assumed that corresponding devices in a single row match each other. Thus, for example, the transistors 312, 314 and 316 match each other as do the transistors 318, 320 and 322, etc.

Transistors 312, 314 and 316 comprise NPN transistors that are each configured as emitter followers having their collectors connected to the Iinsense+ node 300. The base of transistor 312 is connected to the Iinsense− pin at node 326. The bases of transistors 214 and 216 are connected to the Iinsense+ pin at node 300. The current to power the internal current sense circuitry of the integrated circuit is thus sourced through the Iinsense+ pin at node 350 except for the base current provided to transistor 312. The base current of transistor 312 is generally negligible compared to the load current flowing through the inductor 302 and to the sensed current flowing through resistor 310, so the base current of transistor 312 is ignored.

The emitters of transistors 312, 314 and 316 are connected to the emitters of PNP transistors 318, 320 and 322 at nodes 319, 321 and 323, respectively. Transistor 320 has its base connected to its collector to form a reference diode. The base of transistor 320 is additionally connected to the bases of each of transistor 318 and transistor 322. P-channel transistors 328, 330 and 332 each have their sources connected to the collectors of transistors 318, 320 and 322 at nodes 329, 331 and 333, respectively. P-channel transistor 330 has its gate connected to its drain to form a MOS diode. The gate of transistor 330 additionally connects to the gates of each of transistors 328 and 332. The drain of transistor 328 connects to the gate and drain of an NMOS mirror master transistor 334. The source of transistor 334 connects to ground through a degeneration resistor 336. The drain of transistor 332 connects to the drain of NMOS transistor 338. The source of transistor 338 is also connected to ground through a degeneration transistor 340. Transistor 338 and resistor 340 form a matched mirror slave to transistor 334 and resistor 336.

An N-channel transistor 342 has its drain connected to the drain of transistor 330. A current source 344 is connected to the source of the transistor 342 and the current source 344 is also connected to ground. The current source 344 sinks current from node 343. In the present embodiment, the current sink 344 is set to 4 microamps. This causes the entire circuit to consume only 10 s of microamps. The gate of transistor 342 is biased to have enough voltage at its source to enable the current sink 344 to function. The current sinking through the current sink 344 flows through transistor 342, transistor 330, transistor 320 and transistor 314 such that the current is eventually sourced from node 300 at the Iinsense+ pin. The current flowing through transistors 314, 320, 330 and 342 sets up bias voltages at the gates of transistors 328, 330 and 332 and at the bases of transistors 318, 320 and 322.

The voltage at the Iinsense− node 226 is held equal to the voltage at the Iinsense+ node 300 by 350 amplifier forcing the voltages on the drain of transistors 338 and 334 equal, and all of the base emitter voltages, collector emitter voltages, collector source voltages and drain source voltages in the column of transistors 316, 322 and 332 equal to the corresponding voltages in the left column consisting of transistors 312, 318 and 328, equal current will flow in each of these columns due to normal matching. The voltages in the middle column consisting of transistors 314, 320 and 330 will differ slightly due to the drain source voltage of transistors 328 and 332, and the base current for transistors 318, 320 and 322 subtracting from the current through transistors 320 and 314. The matching of the middle column of transistors 314, 320 and 330 is close enough such that the bias currents from the left and right columns can be set closely by setting the sinking current from the current sinking source 344 within the middle column.

An operational amplifier 350 has its non-inverting input connected to the drain of transistor 334 at node 351 and the inverting input of the op-amp 350 is connected to the drain of transistor 338 at node 353. The op-amp 350 compares the voltages at the drains of transistors 334 and 338. Thus, in one example, if the current flowing through resistors 306 and 310 cause the voltage at the Iinsense− node 326 to be higher than the voltage at the Iinsense+ node 300, the base emitter voltage (VBE) of transistor 312 and the base emitter voltage of transistor 318 will be larger than the base emitter voltage of transistors 316 and 322. This will cause more current to flow into transistor 334 than into transistor 338. Since transistor 338 tries to mirror the current of transistor 334, the voltage at the drain of transistor 334 will be higher than the voltage at the drain of transistor 338. This will cause the op-amp 350 to drive transistor 352 harder (increasing its drain current). Transistor 352 comprises an N-channel transistor having its drain/source path connected between node 355 and node 357. A resistor 354 connects with the source of transistor 352 at node 357 and to ground. The drain of transistor 352 connects to the source of a second transistor 356 at node 355. The drain of transistor 356 is connected to the Iinsense− pin at node 326. The gate of transistor 356 is biased to a desired voltage.

The output of the op-amp 350 may connect to additional stages consisting of an N-channel transistor 358 having its gate connected to the output of the op-amp 350. The drain/source path of transistor 358 is connected between node 359 and node 361. A resistor 360 connects to the source of transistor 358 at node 361 and to ground. A current source 362 sources current to node 359 at the drain of transistor 358. An output may be provided from node 359 to act as a catastrophic failure detector.

When the op-amp 350 drives transistor 352 this creates a voltage across resistor 354 and current sinking through the drain of transistor 352. The sinking current through the drain of transistor 352 is passed through a cascode stage consisting of transistor 356 and is sinked from the Iinsense− pin at node 326. The sinking current from node 326 increases the voltage drop across resistors 306 and 310 and lowers the voltage at the base of transistor 312. Lowering the voltage at the base of transistor 312 lowers the base emitter voltage of transistors 312 and 318 compared to the base emitter voltage of transistors 316 and 322. This lowers the current though the left column and into transistor 334. This causes the voltage of transistor 334 to correct downward, making the voltage at nodes 351 and 353 at the drains of transistors 334 and 338 match. Therefore, the currents flowing through the left and the right columns are matched, only a current proportional to the current of the input inductor flows through the transistor 352.

One or more NMOS devices and source resistors such as transistor 358 and resistor 360 can be added to match transistor 352 and resistor 354. If the drain of transistor 358 is connected to a voltage reasonably close to that of transistor 352, the currents through the transistors will match. Thus, one or more copies of the current needed to correct for the current through resistors 306 and 310 can be generated. This current copy may be connected, for instance, to a reference current source 362 for a current strip as illustrated in FIG. 3. If the current exceeded that of the reference current, the voltage would pull down and could be detected.

In an alternative embodiment, a copy of the current may also be connected to a current input analog-to-digital converter to develop a digital representation of the current. Note that the bipolar transistors 312, 314, 316, 318, 320 and 322 do not require high collector emitter voltage or base collector voltage. They have the ability to float above the substrate by whatever the common mode voltage is of Iinsense− and Iinsense+. The only device that needs to withstand the voltage across them, such as the drain to source voltage, are the PDMOS devices 328, 330 and 332 and the NDMOS devices 342 and 356. Transistor 330 only needs high voltage floating capability like bipolar transistors, but for purposes of matching transistors 328 and 332, would most likely also be PDMOS type devices. The common mode input voltage range is therefore limited at the upper end by the bipolar "float" capability and the NDMOS and PDMOS drain to source voltage breakdown. The low end of the common mode range is the sum of the two base emitter voltages, a gate to source voltage and a little more for current sinking. This might typically be approximately 3 volts total.

If the collector emitter voltage capability of the PNP transistors 318 and 322 were high enough, the PDMOS devices 328, 330 and 332 could be removed. The collectors of transistors 318 and 322 would connect to transistors 334 and 338, and the base of transistor 320 and the collector of transistor 320 would connect to transistor 342. If the drain to source voltage capability of transistor 352 were high enough, the cascode device consisting of transistor 356 could be removed.

Figure 4:
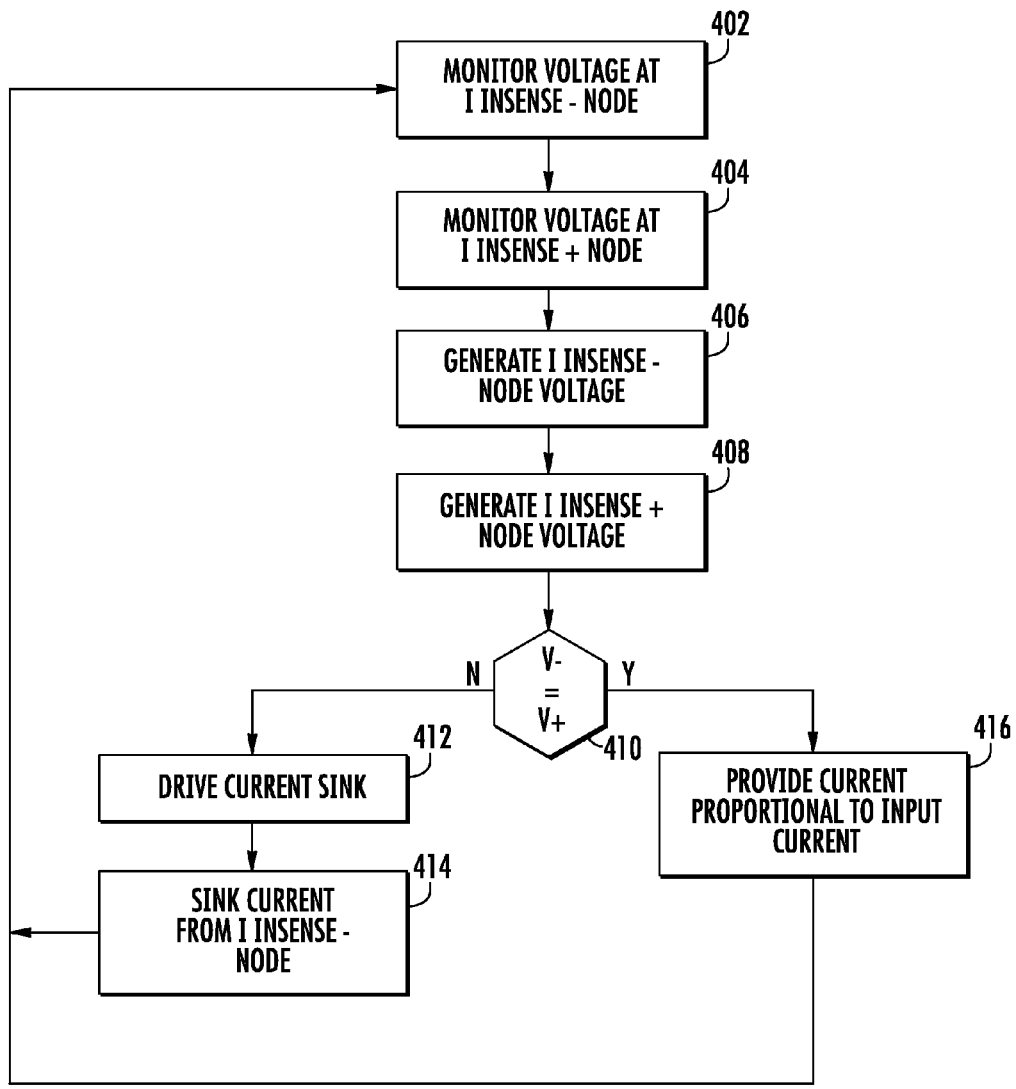
FIG. 4 is a flow diagram describing the operation of the circuitry of FIG. 3.

Referring now to FIG. 4, there is illustrated a flow diagram discussing the operation of the circuit of FIG. 3. Initially at step 402, the circuit monitors the voltage at the Iinsense− node 326. Next, at step 404, the voltage at the Iinsense+ node 300 is monitored. A voltage associated with the Iinsense− node is generated at step 406 responsive to the Iinsense− voltage monitored at node 326. Similarly, a voltage associated with the Iinsense+ node is generated at step 408 responsive to the Iinsense+ node voltages. Inquiry step 410 determines whether the voltage at the Iinsense− node is equal to the voltage at the Iinsense+ node using the operational amplifier 350. If the Iinsense− voltage is greater, the current sink connected to the output of the op-amp 350 is driven at step 412. This sinks current from the Iinsense− node at step 414 causing the voltage associated with the Iinsense− node to be decreased. Control passes back to step 402 to continue monitoring the currents associated with each of the Iinsense− and Iinsense+ nodes. If inquiry step 410 determines that the voltages associated with the Iinsense+ and Iinsense− nodes are equal, the current sink sinks a current proportional to the input current at step 416. Control passes back to step 402 to continue monitoring the Iinsense− and Iinsense+ voltages.

The disclosed current monitoring circuitry enables a way for an integrated circuit controller to input and measure the DC resistance signals through an associated inductor even if the common mode voltage is well above the controller supply voltage. The circuit can work with input common mode voltages ranging from 3 volts to 50 volts and higher with out altering the described implementation. The circuit structure is simple and effective and only requires a small bias current.

It will be appreciated by those skilled in the art having the benefit of this disclosure that this system and method for high precision current sensing using DC resistance of an inductor. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An apparatus for sensing an input current of a voltage regulator supplied through an inductor, the apparatus comprising:
   an RC circuit configured for connection in parallel with the inductor;
   an integrated circuit including first and second input pins, the RC circuit also connected across the first and second input pins, the integrated circuit further including, a voltage monitoring circuit for monitoring a first voltage at the first input pin of the integrated circuit and for monitoring a second voltage at the second input pin of the integrated circuit;

an op-amp for comparing the first voltage with the second voltage and generating a control output responsive to the comparison; and a current sink circuit operable responsive to the control output to sink a current for controlling the first voltage to substantially equal the second voltage, wherein the value of the current that the current sink circuit sinks is proportional to the input current through the inductor.

2. The apparatus of claim 1, wherein the voltage monitoring circuit further comprises:

a current mirror for generating the first voltage and the second voltage, the current mirror comprising:
first voltage generation circuitry for monitoring the first voltage at the first input pin;
second voltage generation circuitry for monitoring the second voltage at the second input pin;
bias circuitry for generating a bias voltage for the first voltage generation circuitry and the second voltage generation circuitry.

3. The apparatus of claim 1, wherein the current sink circuit is configured to sink a current from the first input pin in a first mode of operation responsive to a determination that the first voltage exceeds the second voltage, and is configured not to sink the current from the first input pin in a second mode of operation responsive to a determination that the first voltage substantially equals the second voltage.

4. The apparatus of claim 1, wherein at least one additional current sink circuit is connected to the output of the operational amplifier.

5. The apparatus of claim 1, wherein the RC circuit further comprises:

a first resistor connected to a first end of the inductor;
a capacitor in series with the first resistor and connected to the second end of the inductor; and
a second resistor connected between the connection of the first resistor and the capacitor and the first input pin.

6. The apparatus of claim 5 wherein the current through the first resistor and the second resistor into the first input pin is proportional to the current through the inductor.

7. An apparatus, comprising:

a voltage regulation circuit for generating an output voltage responsive to an input voltage, the voltage regulation circuit comprising:
switching transistors; and
an output filter including an output inductor and a capacitor;
an input inductor connected between an input power supply and the voltage regulation circuit;
current sensing circuitry for sensing an input current through the input inductor of the voltage regulator, the current sensing circuitry comprising:
an RC circuit connected in parallel with the inductor across first and second input pins of an integrated circuit;
a voltage monitoring circuit for monitoring a first voltage at the first input pin of the integrated circuit and for monitoring a second voltage at the second input pin of the integrated circuit;
a comparing circuit for comparing the first voltage with the second voltage and generating a control output responsive to the comparison; and a current sink circuit responsive to the control output for controlling the first voltage to substantially equal the second voltage, wherein the current sink circuit is configured to sink a current having a value indicating the value of the input current through the input inductor.

8. The apparatus of claim 7, wherein the voltage monitoring circuit further comprises:

a current mirror for generating the first voltage and the second voltage, the current mirror comprising:
first voltage generation circuitry for monitoring the first voltage at the first input pin; and
second voltage generation circuitry for monitoring the second voltage at the second input pin; and
bias circuitry for generating a bias voltage for the first voltage generation circuitry and the second voltage generation circuitry.

9. The apparatus of claim 7, wherein the current sink circuit is configured to sink a current from the first input pin in a first mode of operation responsive to a determination that the first voltage exceeds the second voltage, and is configured not to sink the current from the first input pin in a second mode of operation responsive to a determination that the first voltage substantially equals the second voltage.

10. The apparatus of claim 7, wherein at least one additional current sink circuit is connected to the output of the operational amplifier.

11. The apparatus of claim 7, wherein the RC circuit further comprises:

a first resistor connected to a first end of the inductor;
a capacitor in series with the first resistor and connected to a second end of the inductor; and
a second resistor connected between the connection of the first resistor and the capacitor and the first input pin.

12. The apparatus of claim 11, wherein the current through the first resistor and the second resistor into the first input pin is proportional to the current through the inductor.

13. A method for sensing an input current through an inductor, the method comprising:
generating a first voltage and a second voltage, the difference between the two voltages being representative of an input current through the inductor using an RC circuit connected in parallel with the inductor across a first and second input pins of an integrated circuit;
monitoring the first voltage at the first input pin of the integrated circuit and the second voltage at the second input pin of the integrated circuit;
comparing the first voltage with the second voltage;
generating a control output responsive to the comparison; and
sinking a current from the first input pin responsive to the control output to adjust the first voltage to be approximately equal to the second voltage, wherein the value of the current being sinked indicates the value of the input current through the inductor.

14. The method of claim 13, wherein the step of monitoring further comprises the step of generating the first voltage responsive to the monitored first voltage and the second voltage responsive to the monitored second voltage.

15. The method of claim 13, wherein the step of sinking further comprises the step of driving a current sink responsive to the control output in a first mode of operation to initiate sinking the current from the first input pin.

16. The method of claim 13, further comprising the step of limiting a current from a current sink responsive to the control output in a second mode of operation.

17. The apparatus of claim 3, wherein the current sink further comprises:
a resistor;
a transistor connected between the first input pin and resistor; and
wherein when the transistor is controlled by the control output of the operational amplifier to attempt to have the first voltage associated with the first input pin substantially equal the second voltage associated with the second input pin.

18. The apparatus of claim 9, wherein the current sink further comprises:
a resistor;
a transistor connected between the first input pin and resistor; and
wherein when the transistor is configured to be controlled by the control output of the operational amplifier to attempt to have the first voltage associated with the first pin substantially equal the second voltage associated with the second pin.

19. The method of claim 13, further comprising:
sinking a current from the first input pin in a first mode of operation responsive to the control output indicating that the first voltage exceeds the second voltage; and
controlling sinking of the current from the first input pin in a second mode of operation responsive to the control input indicating that the first voltage substantially equals the second voltage.

20. An integrated circuit operable to sense an input current of a voltage regulator, the integrated circuit comprising:
a first input pin and a second input pin, the first and second input pins adapted to have an input inductor coupled across the first and second input pins and an RC circuit coupled in parallel with the input inductor across the first and second input pins;
a voltage detection circuit operable to detect a first voltage on the first input pin of the integrated circuit and to detect a second voltage on the second input pin of the integrated circuit, the voltage detection circuit operable to generate a control signal responsive to the difference between the first and second voltages; and
a current sensing circuit operable responsive to the control signal to sink a sense current from the first input pin, the sense current having a value that causes the first voltage to be approximately equal to the second voltage and the value of the sense current indicating the value of a current through the input inductor.

* * * * *

UNITED STATES PATENT AND TRADEMARK OFFICE
CERTIFICATE OF CORRECTION

| | | |
|---|---|---|
| PATENT NO. | : 9,088,208 B2 | Page 1 of 1 |
| APPLICATION NO. | : 12/840958 | |
| DATED | : July 21, 2015 | |
| INVENTOR(S) | : Robert H. Isham and Jue Wang | |

It is certified that error appears in the above-identified patent and that said Letters Patent is hereby corrected as shown below:

Claims

In Claim 18, Column 9, line 16 of the patent, please delete the text "when"

Signed and Sealed this
Twenty-second Day of December, 2015

Michelle K. Lee
*Director of the United States Patent and Trademark Office*